United States Patent
Parris et al.

(10) Patent No.: US 9,741,793 B2
(45) Date of Patent: Aug. 22, 2017

(54) SEMICONDUCTOR DEVICE WITH FALSE DRAIN

(75) Inventors: Patrice M. Parris, Phoenix, AZ (US); Weize Chen, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 1171 days.

(21) Appl. No.: 13/448,062

(22) Filed: Apr. 16, 2012

(65) Prior Publication Data
US 2013/0270635 A1 Oct. 17, 2013

(51) Int. Cl.
| | |
|---|---|
| H01L 29/08 | (2006.01) |
| H01L 29/66 | (2006.01) |
| H01L 29/78 | (2006.01) |
| H01L 29/06 | (2006.01) |
| H01L 21/8234 | (2006.01) |
| H01L 27/088 | (2006.01) |
| H01L 29/40 | (2006.01) |

(52) U.S. Cl.
CPC .. H01L 29/0847 (2013.01); H01L 21/823418 (2013.01); H01L 27/088 (2013.01); H01L 29/063 (2013.01); H01L 29/0634 (2013.01); H01L 29/66659 (2013.01); H01L 29/7835 (2013.01); *H01L 29/0653* (2013.01); *H01L 29/402* (2013.01)

(58) Field of Classification Search
CPC ............... H01L 29/063; H01L 29/0634; H01L 29/7835; H01L 29/66659
See application file for complete search history.

(56) References Cited

U.S. PATENT DOCUMENTS

| | | | | |
|---|---|---|---|---|
| 2,317,871 | A * | 4/1943 | Zimmerman | 62/332 |
| 5,322,804 | A * | 6/1994 | Beasom | 438/227 |
| 5,541,435 | A * | 7/1996 | Beasom | 257/409 |
| 6,102,528 | A * | 8/2000 | Burke et al. | 347/59 |
| 6,548,839 | B1 | 4/2003 | Strachan et al. | |
| 6,727,547 | B1 | 4/2004 | Brisbin et al. | |
| 7,074,681 | B2 | 7/2006 | de Fresart et al. | |
| 7,560,324 | B2 * | 7/2009 | Chidambaram | 438/179 |
| 8,389,341 | B2 * | 3/2013 | Huang et al. | 438/140 |
| 2005/0275037 | A1* | 12/2005 | Chung | 257/374 |
| 2008/0138946 | A1* | 6/2008 | Lee | 438/200 |
| 2008/0251863 | A1* | 10/2008 | Huang et al. | 257/409 |
| 2009/0001462 | A1* | 1/2009 | Huang et al. | 257/343 |
| 2009/0140335 | A1* | 6/2009 | Schneider et al. | 257/344 |

(Continued)

OTHER PUBLICATIONS

Chih-Chang Cheng et al., "Impact of Self-Heating Effect on Hot Carrier Degradation in High-Voltage LDMOS," IEEE, pp. 881-884 (2007).

(Continued)

Primary Examiner — Jarrett Stark (57) ABSTRACT

An electronic apparatus includes a semiconductor substrate and first and second transistors disposed in the semiconductor substrate. The first transistor includes a channel region and a drain region adjacent the channel region. The second transistor includes a channel region, a false drain region adjacent the channel region, and a drain region electrically coupled to the channel region by a drift region such that the second transistor is configured for operation at a higher voltage level than the first transistor. The respective channel regions of the first and second transistors have a common configuration characteristic.

14 Claims, 6 Drawing Sheets

(56) References Cited

U.S. PATENT DOCUMENTS

2010/0109080 A1* 5/2010 Huang et al. .............. 257/335
2013/0270635 A1* 10/2013 Parris et al. .............. 257/336
2014/0054694 A1* 2/2014 Min et al. .............. 257/336

OTHER PUBLICATIONS

Sheng-Yi Huang et al., "Novel Pseudo-Drain (PD) RF Power Cell in 0.13 um CMOS Technology," IEEE Radio Frequency Integrated Circuits Symposium, pp. 259-262 (2008).

* cited by examiner

SEMICONDUCTOR DEVICE WITH FALSE DRAIN

FIELD OF INVENTION

The present embodiments relate to semiconductor devices.

BACKGROUND

Integrated circuits (ICs) and other electronic devices often include field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power and high voltage transistor devices are designed to be tolerant of the high currents and voltages that are present in applications such as physical interfaces, motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side.

LDMOS devices are often used in applications, such as automotive applications, involving operational voltages greater than 45 Volts. Breakdown resulting from applying such high voltages to the drain is often prevented through a reduced surface field (RESURF) structure of the LDMOS device design. The RESURF structure is designed to deplete the drift space in the LDMOS device in both vertical and lateral directions, thereby reducing the electric field near the surface at the drift region and thus raising the off-state breakdown voltage (BVDSS) of the device.

The development of an LDMOS device capable of operating at higher operating voltages typically includes a considerable amount of reliability testing. For example, each new device design is subjected to testing for hot carrier injection (HCI) effects and other gate oxide (GOX) reliability. Significant time and resources are often expended during both the development of devices capable of passing these tests and the implementation of such testing.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Laterally diffused metal oxide semiconductor (LDMOS) and other power transistor devices and electronic apparatus are configured with false drains. The false drain may be disposed at an intrinsic location adjacent a channel region of the device. For instance, the false drain may replace (or be disposed in, near, or along) an accumulation region of the device. The incorporation of a false drain into the LDMOS devices may allow such devices to be more quickly integrated into production for the reasons described below.

With the false drain, the LDMOS device may emulate an existing lower voltage transistor design. In some embodiments, the lower voltage transistor is a self-aligned MOSFET device. The incorporation of the false drain at an intrinsic location changes the internal electric field distribution to emulate or match the distribution with the existing lower voltage device. With the false drain, the LDMOS and the lower voltage device have a channel region with a common configuration. Because reliability data already exists for the lower voltage transistor design, such emulation of the lower voltage device may thus facilitate the development of the LDMOS device. The development of the LDMOS may rely on the reliability data acquired during the development of the lower voltage device. For instance, the reliability data may have been directed to characterization of hot carrier injection (HCI) and gate oxide (GOX) reliability. The reliability characterization of the lower voltage device may thus be applied to the LDMOS device, thereby rendering further efforts toward collection of HCI and GOX data for the LDMOS device unnecessary. Higher voltage tier MOSFET devices may be developed without using resources and time for additional reliability characterization.

The false drain may also be used to measure intrinsic voltage levels reached during operation. During operation, an external bias voltage is applied to the drain region rather than the false drain. If the intrinsic voltage levels do not exceed the voltages reached during the reliability testing of the lower voltage device, then the results of the reliability testing are also applicable to the LDMOS device. The false drain of the disclosed devices thus allows the re-use of the GOX and HCI reliability data acquired during development of the lower-voltage tier MOSFET devices.

The fabrication of the low and high voltage tier devices in an electronic apparatus may share several fabrication procedures. In some embodiments, the LDMOS or other high voltage tier device may be configured as a low voltage tier device with the exception of a drift region and an additional drain region electrically coupled to a false drain by the drift region. The components of the LDMOS device may be formed via fabrication procedures also used to fabricate the LV device.

The structural and design characteristics of the higher voltage devices may vary away from the channel region. For example, the drift region of the high voltage device may be configured as an active drift region or as a field drift region. The drift region may include one or more electric field reduction structures or components. One exemplary field reduction structure is configured as a polysilicon flap or layer on an isolation trench. Alternatively or additionally, one or more reduced surface field (RESURF) structures may be integrated with the drift region. Any one or more of these features may be used to control the electric field in the drift region to optimize the device design for the tradeoff between on-resistance (RDSon) and off-state breakdown voltage (BVDSS).

Although described below in connection with n-channel LDMOS transistors, the disclosed devices are not limited to any particular transistor configuration. For instance, application of the features of the disclosed devices is not limited to LDMOS devices. The false drain regions are also not limited to any one particular type of LDMOS configuration. For instance, the disclosed devices may have varying types of RESURF structures, including single, double, or other RESURF structural arrangements, each of which may be referred to herein as a "RESURF transistor."

The nature of the disclosed electronic apparatus may vary. In some cases, the electronic apparatus includes both higher voltage tier and lower voltage tier devices. For example, such devices may be integrated in a system on a chip (SoC) product. In other cases, the electronic apparatus only includes high voltage or power transistor devices. The advantages of the internal false drain may still be achieved despite the absence of lower voltage tier devices in the electronic apparatus or product. The reliability data available for such lower voltage tier devices may nonetheless be relied upon during development of the apparatus or product having the higher voltage tier devices.

The lower voltage tier device is not limited to a self-aligned MOSFET device or a logic device, such as a CMOS logic transistor. The design of the lower voltage tier transistor device may vary. For example, the lower voltage tier transistor may be another power transistor, albeit one configured for operation at a lower voltage level (e.g., drain-source bias voltage) than the higher voltage tier transistor having the false drain. Thus, in some cases, both the lower and higher voltage tier transistors may have drift regions and/or other characteristics of power transistor devices.

For convenience of description and without any intended limitation, n-channel devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below. Both NMOS and PMOS devices may be fabricated, for either one or both of the low voltage and high voltage devices.

Figure 1:
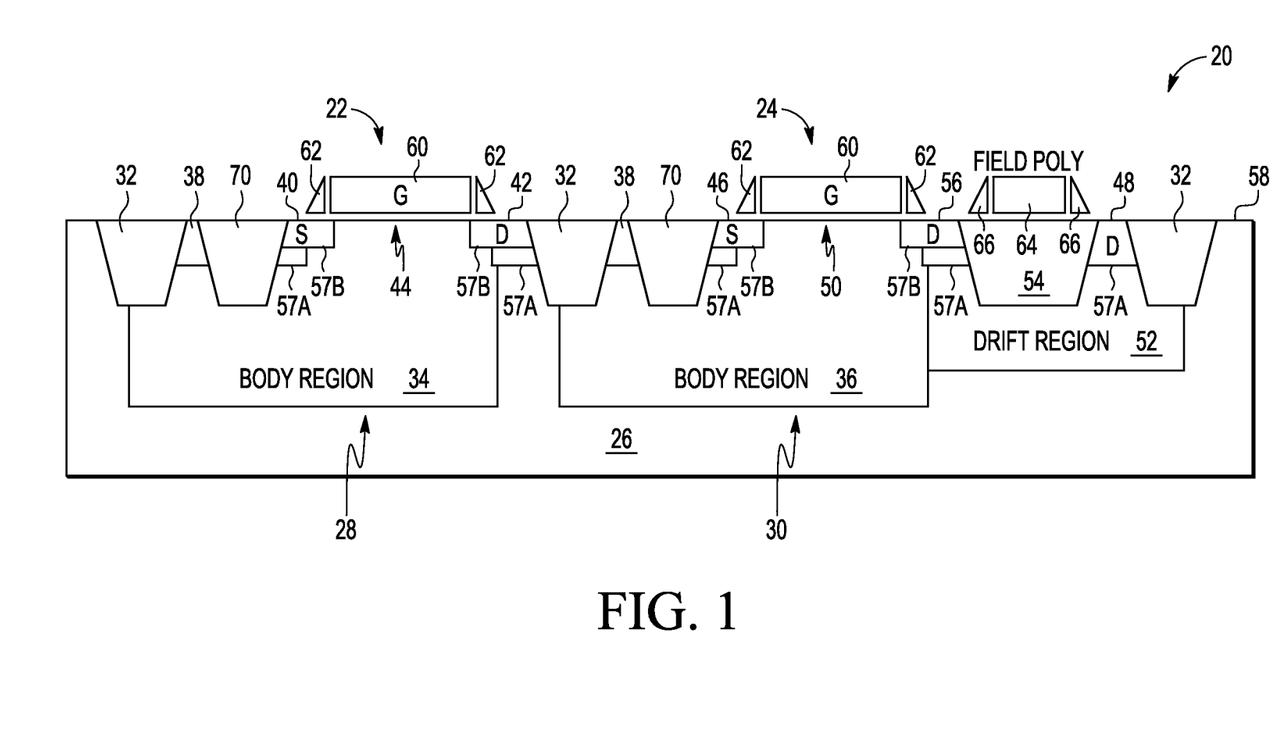
FIG. 1 is a cross-sectional, schematic view of an exemplary electronic apparatus having a low voltage MOS transistor and a field drift LDMOS transistor with a false drain in accordance with one embodiment.

FIG. 1 is a schematic cross-sectional view of an example of an electronic apparatus 20 having an n-channel self-aligned MOSFET device 22 and an n-channel field LDMOS device 24 constructed in accordance with one embodiment. The apparatus 20 includes a semiconductor substrate 26 in which the devices 22 and 24 are disposed. The semiconductor substrate 26 may include a number of epitaxial layers. For example, the semiconductor substrate 26 includes a single p-type epitaxial layer grown on an original substrate (e.g., a heavily doped p-type substrate). The semiconductor substrate 26 may include an isolation layer (e.g., a n-type barrier layer, or NBL). Any one or more of the layers of the semiconductor substrate 26 may include silicon. The structural, material, and other characteristics of the semiconductor substrate 26 may vary from the example shown. For example, the semiconductor substrate 26 may include a silicon-on-insulator (SOI) construction. Additional, fewer, or alternative layers may be included in the semiconductor substrate 26. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

Respective active areas 28 and 30 of the devices 22, 24 are defined by a number of shallow trench isolation (STI) regions 32. Additional or alternative isolation regions may be used. For example, isolation wells, rings, or sinks may be used to define one or both of the active areas 28, 30. The STI regions 32 and/or other isolation regions may laterally surround and define the lateral peripheries of the active areas 28, 30. The active areas 28, 30 may be defined in the vertical dimension via further isolation layers or barriers (not shown). For example, one or more N-type buried layers (NBL) may be formed or disposed in the semiconductor substrate 26 (e.g., in an epitaxial layer thereof). The NBL(s) may extend across (e.g., under) one or both of the active areas 28, 30 of the devices 22, 24 to act as a barrier or isolation layer separating the active areas 28, 30 from the remainder of the substrate 26. One or more of the above-described isolation regions may have a dopant concentration level and/or be otherwise configured for high voltage (HV) operation (e.g., high side operation), including punch-through prevention. Any number of the isolation wells, sinks, or buried layers may be connected to one another.

The MOSFET device 22 is generally configured for operation at a lower voltage level or tier than the LDMOS device 24. In one example, the MOSFET device 22 is a logic device (e.g., an operating voltage of about 1.2V). In other examples, the MOSFET device 22 is a Flash device (e.g., an operating voltage of about 9V). The MOSFET device 22 may be referred to as a low voltage (LV) device with the understanding that the voltage level is relative to the voltage level of the LDMOS device 24 (or other high voltage (HV) tier devices).

The LV device 22 includes a body region 34 in the active area 28. The LDMOS device 24 includes a body region 36 in the active area 30. In some examples, the body regions 34, 36 may be formed via a common implantation procedure and, thus, have a common configuration. In this example, the body regions 34, 36 include respective p-type wells formed in the semiconductor substrate 26. The body regions 34, 36 are biased via one or more heavily doped p-type body contact regions or electrodes 38 formed in or otherwise above the p-type well of the body region 34, 36 in the semiconductor substrate 26. The dopant concentration of each contact region 38 may be at a level sufficient to establish an ohmic contact to the body region 34, 36. In some embodiments (e.g., non-isolated N-type devices), the body regions 34, 36 may share a body contact.

The LV device 22 includes a source region 40, a drain region 42, and a channel region 44 between the source and drain regions 40, 42, in the semiconductor substrate 26. As a self-aligned device, both the source and drain regions 40, 42 are adjacent the channel region 44. The LDMOS device 24 includes a source region 46, a drain region 48, and a channel region 50 between the source region 46 and the drain region 48. The drain region 48 is spaced from the channel region 50 to allow for high voltage operation. Each source region 40, 46 is disposed within the respective body region 34, 36 of the device 22, 24. The respective channel regions 44, 50 of the devices 22, 24 may have a common configuration or one or more common configuration characteristics, as described below.

In the LDMOS device 24, the drain region 48 is electrically coupled to the channel region 50 and the body region 36 by a drift region 52 in the semiconductor substrate 26. In this example, the drift region 52 includes an n-type well. The drain region 48 may be formed on or otherwise above the well of the drift region 52, although other overlapping arrangements may be used. The LDMOS device 24 is thus configured for operation at a higher voltage level than the LV device 22. In this example, the drift region 52 includes a field drift region with an STI region 54.

The LDMOS device 24 includes a false drain region 56 in the semiconductor substrate 26. The false drain region 56 is disposed adjacent the channel region 50. The false drain region 56 is spaced from and/or electrically coupled to the drain region 48 by the drift region 52. The false drain region 56 may extend across or be disposed along a boundary between the body region 36 and the drift region 52. The position of the false drain region 56 relative to the body region 36 and the drift region 52 may vary. The false drain region 56 and the drain region 42 of the LV device 20 may be formed via a common implantation procedure. In this example, the false drain region 56 and the drain region 42 have one or more configuration characteristics or features in common (i.e., common configuration characteristics). In some cases, the false drain region 56 and the drain region 42 have a common configuration. Examples of common configuration characteristics include dopant concentration level or profile, depth, lateral shape or dimensions, composite arrangement of sub-regions (e.g., a moderately doped sub-region), etc. The false drain region 56 and the drain region 42 may have additional, fewer, or alternative characteristics in common.

Each source region 40, 46 and drain region 42, 48 may include a respective heavily doped region in the semiconductor substrate 26. In this example, each source and drain region includes an n+ doped electrode or contact portion 57A. The source and drain regions (or a portion thereof) may thus have a dopant concentration at a level sufficient to establish ohmic contacts for biasing the respective source or drain region. In a typical MOSFET or LDMOS configuration, the drain region 42, 48 is biased at a high voltage, Vds, relative to the source region 40, 46, which may, for example, be considered to be at ground potential. Each device 22, 24 may have any number of source or drain regions.

The false drain region 56 may also include a heavily doped region 57A in the semiconductor substrate 26. The false drain region 56 may thus have a dopant concentration at a level sufficient to establish an ohmic contact, even though the false drain region 56 may not be used during operation. The dopant concentration level or profile of the false drain region 56 may mirror the dopant concentration level or profile of the drain region 42 of the LV device 22.

Each source region 40, 46 and drain region 42, 52 may be configured as a composite arrangement of sub-regions. The composite arrangement includes the above-described n+ contact portion 57A and a lightly or intermediately doped transition regions 57B. In this example, the transition regions 57B include a moderately or lightly doped drain (LDD) portion 57B. Each transition region 57B may be or include a diffused region formed in connection with the corresponding contact portion 57A. Such transition regions may assist in controlling the electric field at or near a surface 58 of the semiconductor substrate 26. Each LDD portion 57B may be disposed along the surface 58 adjacent to a respective one of the channel regions 44, 50. Each LDD portion 57B may extend further inward than the corresponding n+ contact region 57A. In this example, the drain region 48 of the LDMOS device 24 is configured without an LDD portion. In alternative embodiments, the drain region 48 may also include an LDD portion, which may be formed via the same implantation procedure directed to forming the other LDD portions 57B. In some cases, the STI region 54 limits the implantation to the region of the contact portion 57A.

The false drain region 56 may also be configured as a composite arrangement of sub-regions (e.g., lightly and heavily doped sub-regions). The composite arrangement of the false drain region 56 may mirror or match the arrangement of the source and drain regions 40, 42 of the LV device 22, as well as the source region 46 of the LDMOS device 24. These regions may thus have a common configuration. The composite arrangement may be a configuration characteristic that the false drain region 56 and the source and/or drain regions 40, 42 have in common. In some cases, e.g., when the electronic apparatus does not include the LV device 22, the LDD portion of the false drain region 56 may mirror or match the LDD portion of the source region 46. The LDD portion of the source region 46 and the false drain region 56 may have a common configuration or one or more common configuration characteristics. For example, these regions or sub-regions may have shape, dopant concentration profile, and/or other characteristics in common.

The devices 22, 24 include one or more gate structures 60 formed on or above the surface 58 of the semiconductor substrate 26. Each gate structure 60 is disposed between a respective one of the source regions 40, 46 and a respective one of the drain regions 46, 48. The gate structure 60 of the LDMOS device 24 is disposed between the source region 46 and the false drain region 56. The false drain region 56 is disposed adjacent the gate structure 60 to match the positioning of the drain region 42 relative to the gate structure 60 of the LV device 22. Each gate structure 60 is located on or above a gate dielectric (not shown). For example, the gate dielectric may include silicon dioxide (or oxide) deposited or otherwise formed on the surface 58. Each gate structure 60 includes a conductive gate (e.g., a polysilicon layer) on or above the gate dielectric, which insulates the conductive gate from the substrate 26.

Each gate structure 60 may include one or more dielectric sidewall spacers 62 disposed along lateral edges of the gate structure 60. The sidewall spacers 62 may cover the lateral edges to act as a silicide blocker to prevent a silicide short along the surface 58 (e.g., between the gate structures and/or any of the source or drain regions). The sidewall spacers 62 may interpose a material that does not form silicide between materials or regions that can form a silicide. The sidewall spacers 62 may thus maintain the separation of the conductive components of the gate structure 60 from the source region 40, 46, the drain region 42, and the false drain region 56. In this example, the sidewall spacers 62 may also be used for alignment purposes in defining an inner edge of the contact portion 57A of the source regions 40, 46 and the false drain region 56. The LDD portions 57B of the source regions 40, 46, the drain regions 42, 48, and the false drain region 56 may be formed during, e.g., an implantation procedure implemented before the formation of the sidewall spacers 62. The LDD portions 57B may thus extend further inward under the sidewall spacers 62 and the gate structure 60.

The LDMOS device 24 may include more than one gate structure 60. For example, the LDMOS device 24 may have a dual-gate structure. Each such gate structure 60 and the channel region 50 defined beneath the gate structure 60 may mirror or match the gate structure 60 and the channel region 44 of the LV device 22. The components, materials, and other characteristics of the gate structures 60 may otherwise vary from the example shown.

When one of the gate structures 60 is biased, charge carriers (in this case, electrons; alternatively, holes) accumulate in the corresponding channel region 44, 50. In this example, each channel region 44, 50 is located in the respective body region 34, 36 of the device 22, 24 under the gate structure 60. The accumulation of electrons results in a charge inversion in the channel region 44, 50 from the p-type body region 34, 36 to an n-type conduction layer or area near the surface 58 of the semiconductor substrate 26. Once a sufficient amount of the charge carriers accumulate in the conduction layer or area, charge carriers can flow from the source region 40, 46 toward the drain region 42, 48 through the respective channel region 44, 50.

In the LDMOS device 24, the body region 36 need not extend across the entire length of the channel region 50, as in the example shown in FIG. 1. In an alternative embodiment, a portion of the area under the gate structure 60 may be disposed in the drift region 52. That portion may be referred to as part of the channel region 50 and/or as an accumulation region of the device 24. In the example shown in FIG. 1, the accumulation region of the device 24 is replaced by the false drain region 56.

The channel region 50 and the false drain region 56 form part of a conduction region or path of the LDMOS device 24. After passing through the channel region 50 and the false drain region 56, the charge carriers drift through the drift region 52 under the electric field established by the drain-source bias voltage. In this example, the charge carriers drift under and around the STI region 54 to reach the drain region 48.

The drift region 52 may be configured with one or more electric field reduction and/or conduction enhancement structures to reduce the electric field near the surface 58 and/or reduce the on-resistance (RDSon). The field and/or resistance reduction structure(s) may be disposed within the drift region 52 or adjacent the drift region 52. Such field reduction may help avoid breakdown near the surface 58. In this example, the LDMOS device 24 includes a conductive layer 64 disposed above the surface 58 of the semiconductor substrate 26. The conductive layer 64 may be positioned over the drift region 52 between the false drain region 56 and the drain region 48. For example, the conductive layer 64 may include a floating or appropriately biased polysilicon layer or flap above the STI region 54 of the drift region 52. The conductive layer 64 may be formed along with the gate structures 60 and, thus, have one or more features in common therewith. For example, sidewall spacers 66 may be formed along sidewalls of the conductive layer 64. The positioning of the conductive layer 64 with the sidewalls spacers 66 may be used for alignment purposes in connection with the false drain region 56 and/or the drain region 48.

Due to the presence of the false drain region 56, the channel regions 44 and 50 of the devices 22, 24 may have one or more common configuration characteristics. The common configuration characteristic(s) may arise from the emulation of the drain region 42 of the lower voltage device 22 by the false drain region 56. One configuration characteristic that the channel regions 44 and 50 have in common may be a common drain-side end arrangement. For instance, the common drain-side end arrangement may involve how each of the channel regions 44, 50 terminates at a respective one of the LDD regions 57B, which is, in turn, adjacent to a respective one of the heavily doped regions 57A. Alternatively or additionally, the dopant concentration profile of the false drain region 56 may match the profile of the drain region 42. Each LDD region 57B (of the drain region 42 and the false drain region 56) may be aligned with the conductive (e.g., polysilicon) component of the gate structure 60. Each channel region 44, 50 may thus have a drain-side end aligned with the conductive component of the gate structure 60. By replacing the typical accumulation region of an LDMOS device, the false drain region 56 allows these aspects of the channel region 50 to mirror or match the configuration of the channel region 44. Other possible common features include the length of the channel regions 44, 50, the dopant concentration levels of the body regions 34, 36 near the surface 58, the alignment of the heavily doped portions 57A with the sidewall spacers 62, etc.

The emulation of the drain region 42 and the common configuration characteristic(s) of the channel regions 44, 50 may allow the re-use of low voltage tier reliability data already obtained during the development of the low voltage tier devices. The reliability data remains applicable in the development of the high voltage tier device development. The design of the drift region 52 and any associated field management structures (e.g., RESURF structures) maintains the stresses encountered at or near the false drain 56 at or below the stresses encountered at or near the drain region 42 of the low voltage tier device. Beyond the channel region 50 and the false drain region 56, the configuration of the LDMOS device 24 may thus differ from the lower voltage device 22 to accommodate the higher operational voltage of the LDMOS device 24. For instance, the drift region 52 provides breakdown protection, as well as a voltage drop from the drain-source bias applied to the drain region 48. One or more characteristics of the drift region 52 may vary from the example shown. For example, the drift region 52 may be spaced from the body region 36 rather than abutting the body region 36 as shown. Separating the drift region 52 and the body region 36 may provide additional breakdown and HCI protection. Details regarding further alternative features and characteristics of the drift region 52 are set forth below.

The incorporation of the false drain region 56 may result in an increase in the size or area of the LDMOS device 24. The on-resistance of the LDMOS device 24 may also be higher than other LDMOS devices. However, these detriments resulting from the incorporation of the false drain region 56 may be outweighed by the decreases in development time and resources. Products having the LDMOS device 24 may be brought to market more quickly and inexpensively due to reliance on the reliability data obtained for the lower voltage device 22. Moreover, in some cases (e.g., where large operational currents are not carried by the device 24), a higher off-state breakdown voltage level (BVDSS) may be more useful than attaining a minimum on-resistance.

During product development, the false drain region 56 may be used to measure internal voltage levels. The false drain region 56 may provide an access point for such measurements. For example, a test device may include a tap or other structure coupled to the false drain region 56. The measurement data may be used to confirm that the voltage levels reached at or near the false drain region 56 (and/or the channel region 50) do not exceed the limits or maxima reached in the corresponding regions of the lower voltage device 22. The reliability data for the lower voltage device 22 may thus be applicable to the LDMOS device 24.

Further STI regions may be disposed in the semiconductor substrate 26 to isolate various contact regions. For example, an STI region 70 may be used to isolate the body contact regions 38 and the source regions 40, 46. The devices 22, 24 may also include further contact regions. For example, an isolation region or layer may be biased via a respective contact region, which, in turn, may be separated from, e.g., the body contact region 38, by a corresponding STI region. The semiconductor substrate 26 may then be biased relative to the isolation region(s) and/or device body regions 34, 36 via a substrate contact region.

The electronic apparatus 20 is shown in simplified form and, thus, FIG. 1 does not show the conductive contacts and other metal layers configured for electrical coupling with the source regions, the drain regions, and the gate structures. The electronic apparatus 20 may have a number of other structures or components for connectivity, isolation, passivation, and other purposes not shown in FIG. 1 for ease in illustration. For instance, one or both of the devices 22, 24 of the electronic apparatus 20 may include any number of additional isolation regions or layers. For example, an n-type barrier layer (NBL) may extend across the respective active areas 28, 30 of the device(s) 22, 24. The devices 22, 24 may be alternatively or additionally be separated or isolated from one another by an n-type ring-shaped isolation well. One or more further STI regions, isolation trenches, and/or isolation wells (not shown) may be provided to isolate the active areas and/or other regions of the electronic apparatus 20.

The drift region profile may vary to optimize the tradeoff between on-resistance (RDSon) and off-state breakdown voltage (BVDSS). A variety of different profiles may be used to attain a specified breakdown voltage. The profiles may include any number of embedded and/or surface field reduction structures. For example, in the above-described field-drift LDMOS device 24, the field polysilicon structure 64, or flap, on the surface 58 over the STI region 54 is optional. Several examples of alternative field reduction structures are described in connection with FIGS. 2-6B, each of which may be incorporated as an LDMOS device of the electronic apparatus 20.

Figure 2:
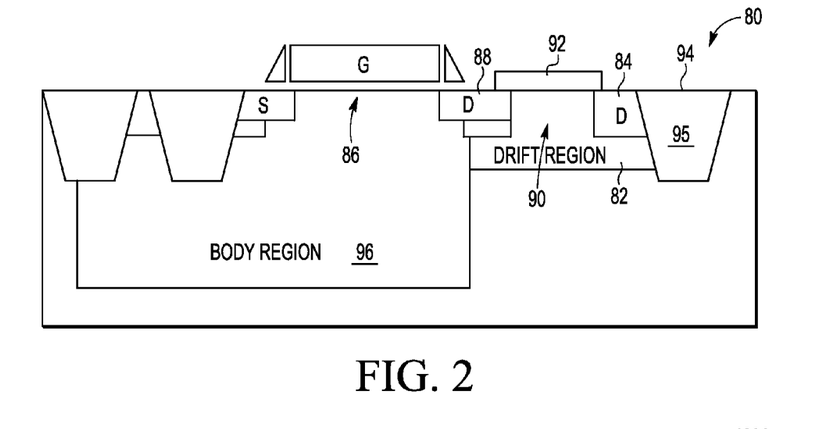
FIG. 2 is a cross-sectional, schematic view of an exemplary active drift LDMOS transistor with a false drain in accordance with one embodiment.

FIG. 2 depicts an LDMOS device 80 having an active drift region 82. A drain region 84 formed on or otherwise above the active drift region 82 is spaced from and/or electrically coupled to a channel region 86 and a false drain region 88 by a trench-free portion 90 of the active drift region 82. The device 80 includes a silicide blocker 92 on a surface 94 of a semiconductor substrate to prevent a short from forming between the false drain region 88 and the drain region 84. The silicide blocker 92 may include, for example, a silicon nitride layer, deposited on or otherwise above the surface 94 over the trench-free portion 90 of the drift region 82. Alternatively or additionally, the device 80 includes a plate or layer of polysilicon or other conductive material disposed above the active drift region 82. The plate or layer may be floating or appropriately biased as described above in connection with the polysilicon flap in the embodiment of FIG. 1.

The portion 90 of the active drift region 82 is trench-free in the sense that no STI region or other passive trench is disposed in or on the active drift region 82. In alternative embodiments, the trench-free portion 90 of the active drift region 82 may include one or more other structures (e.g., a RESURF region) around which the charge carriers drift. The active drift region 82 may form a part of a composite drift or other region or area of the device 80 having an STI region or other passive trench. For example, the device 80 may have an STI region 95 disposed along the drift region of the device 80. The drift region of the device 80 is still considered active, and the portion 90 is still considered trench-free, because the STI region 95 is disposed beyond the drain region 84 rather than between the false drain region 88 and the drain region 84. Other STI regions or trenches not along the conduction path of the device 80 may also be present without changing the trench-free nature of the portion 90.

The LDMOS device 80 may have a number of features in common with the example of FIG. 1. As a result, the channel region 86 and the false drain region 88 of the LDMOS device 80 may match or mirror the corresponding regions of the lower voltage device 22 (FIG. 1). For example, the false drain region 88 may include a composite arrangement of a LDD or other transition region and a heavily doped contact region. A body region 96 may also be disposed adjacent the drift region 82, as in the example of FIG. 1. The false drain region 88 may extend across the boundary between the body region 96 and the drift region 82, as described above. Any one or more of the remaining regions and components of the LDMOS device 80 may be configured similarly relative to the example of FIG. 1.

Figure 3A:
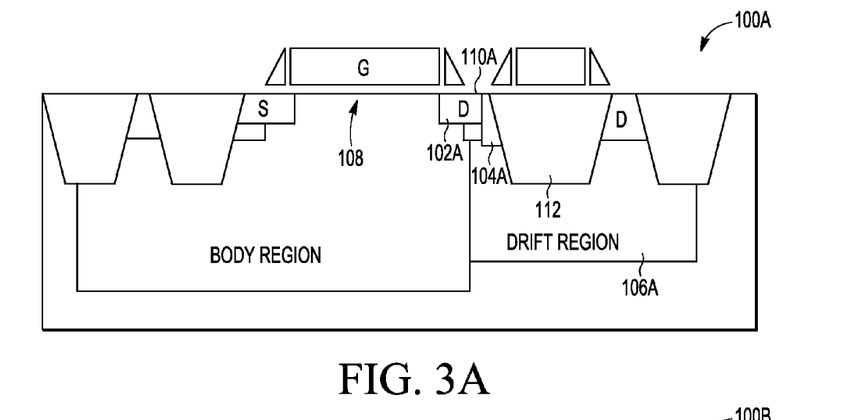
FIGS. 3A and 3B are cross-sectional, schematic views of exemplary field and active drift LDMOS transistors with corner protected false drains in accordance with two embodiments.
Figure 3B:
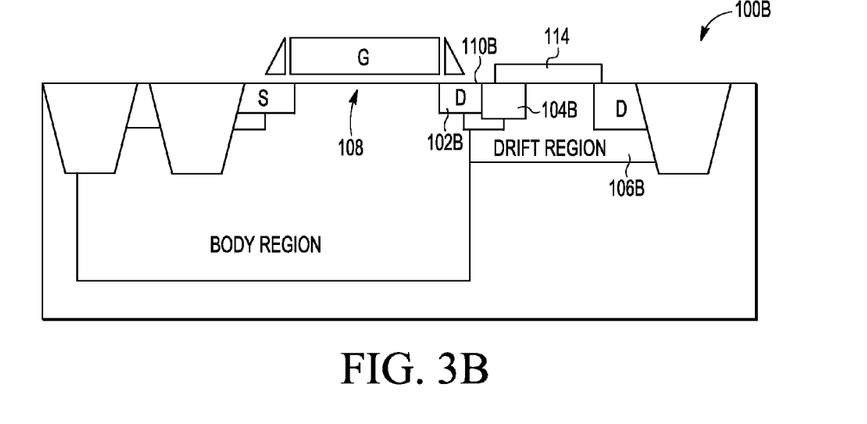

FIGS. 3A and 3B depict examples of LDMOS devices 100A, 100B in which a false drain region 102A, 102B may differ in one or more characteristics from the drain region of the lower voltage device (despite the attempt to emulate the configuration thereof). In these examples, the false drain regions 102A, 102B include a corner protection region 104A, 104B configured to protect a drift region 106A, 106B from carrier injection. Each corner protection region 104A, 104B may be formed by implanting dopant of the opposite conductivity type than the false drain region 102A, 102B and the drift region 106A, 106B. In this example, the corner protection regions 104A, 104B are floating p-type regions. The corner protection regions 104A, 104B are spaced from a respective channel region 108 of the LDMOS device 100A, 100B. The corner protection regions 104A, 104B may be spaced from the channel region 108 so that the relevant reliability test data (e.g., HCI and GOX data) for the drain-side of the low-voltage tier device remains applicable in the high-voltage tier device. The corner protection regions 104A, 104B may add additional protection for areas which do not exist in the low voltage tier device but which may nonetheless decrease the operating fidelity of the false drain in the high voltage tier device. As a result, the channel region 108 of each LDMOS device 100A, 100B may still have one or more configuration characteristics in common with the channel region of the lower voltage device 22 (FIG. 1). In this example, the false drain regions 102A, 102B include a transition region 110A, 110B that separates the corner protection region 104A, 104B from the channel region 108. The respective junctions created between the false drain regions 102A, 102B and the corner protection regions 104A, 104B may steer charge carriers (e.g., electrons) away from an STI region 112 of the LDMOS device 100A and an oxide or other layer of a salicide block 114 of the LDMOS device 100B. Such steering may be achieved despite the common configuration characteristic(s) of the channel regions 108 relative to the examples described above, with which the LDMOS devices 100A, 100B may have other features in common.

Figure 4A:
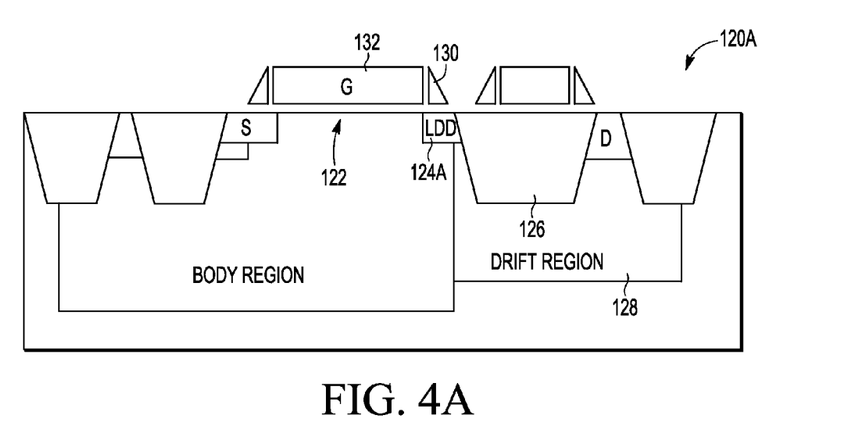
FIGS. 4A and 4B are cross-sectional, schematic views of exemplary field and active drift LDMOS transistors with LDD-only false drains in accordance with two embodiments.
Figure 4B:
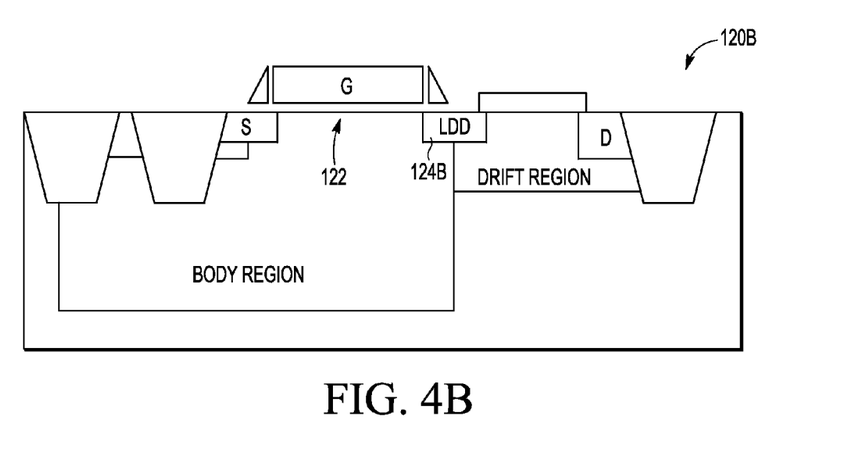

FIGS. 4A and 4B depict LDMOS devices 120A, 120B having respective channel regions 122 that may also have one or more configuration characteristics in common with the channel region of a lower voltage device 22 (FIG. 1). The LDMOS devices 120A, 120B are configured as field drift and active drift devices, respectively. The LDMOS devices 120A, 120B may have drift and other regions that are configured as in the examples described above. In these examples, however, respective false drain regions 124A, 124B of the devices 120A, 120B may have a different configuration than the drain region of the lower voltage device 22. The false drain regions 124A, 124B are configured to match only a transition region (e.g., an LDD portion) of the drain region of the lower voltage device 22. The false drain regions 124A, 124B are thus not configured as composite arrangements having both a transition region and a heavily doped contact region. Removing the contact region from the false drain regions 124A, 124B may decrease or minimize the additional area occupied by the false drain regions 124A, 124B. The false drain regions 124A, 124B may be used to test whether the internal voltage levels reached in the channel regions 122 during operation remain acceptably at or below those of the lower voltage device 22.

The false drain regions 124A, 124B may be formed during the same implantation procedure that forms the transition regions of the lower voltage device 22 and, thus, have one or more configuration characteristics in common therewith. In the field drift design of FIG. 4A, if the alignment capability is sufficient, the combination of an STI region 126 in a field drift region 128 and a drain-side sidewall spacer 130 of a gate structure 132 may be used to mask the dopant implantation directed to forming the source and drain contact regions. Such masking may be useful in fabrication processes in which a single mask is used for both the transition regions (e.g., LDD regions) and the heavily doped contact regions. In other cases (e.g., inadequate alignment or in the active drift design of FIG. 4B), two different masks may be used to form the various source, drain, and false drain regions. Nonetheless, no new steps are added to the fabrication process flow for such devices.

Figure 5A:
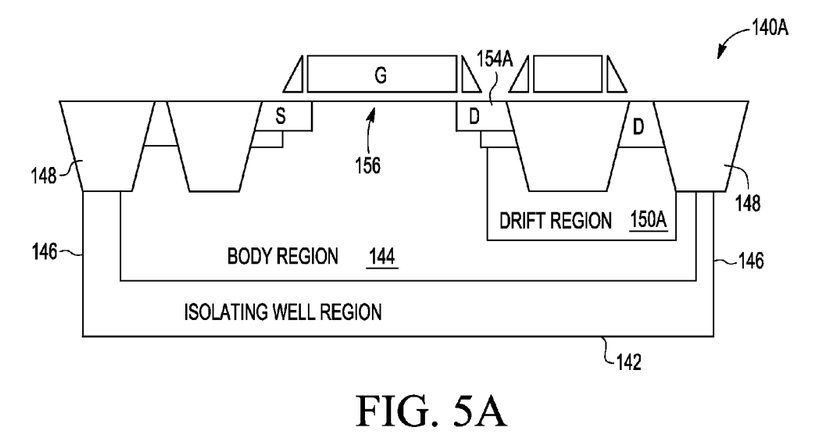
FIGS. 5A and 5B are cross-sectional, schematic views of exemplary field and active drift LDMOS transistors with a false drain in conjunction with an isolation structure in accordance with two embodiments.
Figure 5B:
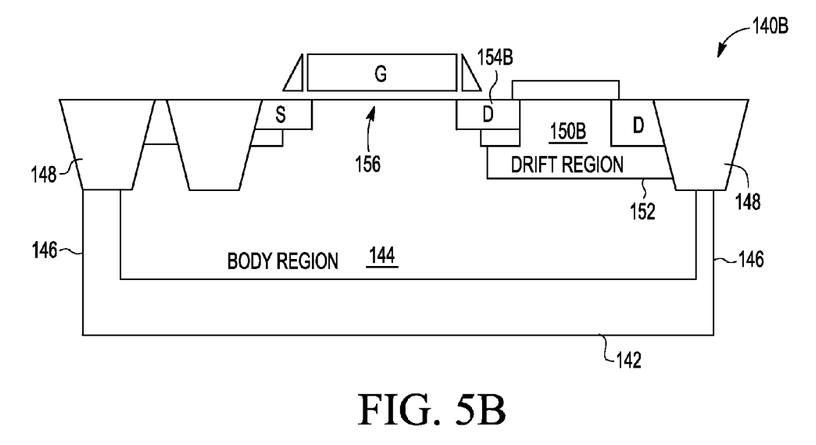

With reference to FIGS. 5A and 5B, LDMOS devices 140A and 140B provide further examples of field reduction structures in combination with the above-described false drain configurations. In these embodiments, an active area of each LDMOS device 140A, 140B is isolated from the surrounding semiconductor substrate by an n-type isolating well region 142. The isolating well region 142 may define the lateral and/or vertical periphery of the respective active areas of the LDMOS devices 140A, 140B. In these examples, the isolating well regions 142 extend across the active area under a respective body region 144 to define the vertical extent of the active area. The isolating well regions 142 include a ring-shaped sink 146 disposed along the lateral periphery of the LDMOS devices 140A, 140B. The respective active areas may also be defined and isolated by STI regions 148 along the lateral periphery.

The isolating well regions 142 may be configured to enable high-side operation of the LDMOS devices 140A, 140B. The body regions 144 may be biased relative to the underlying substrate (see, e.g., FIG. 1) due to the opposite doping of the isolating well regions 142. In these examples, the body regions 144 may extend under respective drift regions 150A, 150B to define a junction region 152, the depletion of which in both the lateral and vertical directions provides a reduced surface field (RESURF) effect. The electric field may be reduced in areas in and/or around the drift regions 150A, 150B to increase the off-state breakdown voltage (BVDSS). The RESURF effect may thus be used to optimize the tradeoff between on-resistance (RDSon) and the off-state breakdown voltage.

The LDMOS devices 140A, 140B include respective false drain regions 154A, 154B adjacent the drift regions 150A, 150B and a channel region 156. Each false drain region 154A, 154B and/or the channel region 156 may thus have a configuration that matches or mirrors the corresponding regions in the lower voltage device 22 (FIG. 1). The configuration of the false drain region 154A, 154B may vary to include, for instance, an LDD-only configuration and/or a corner protection region, as described above.

Figure 6A:
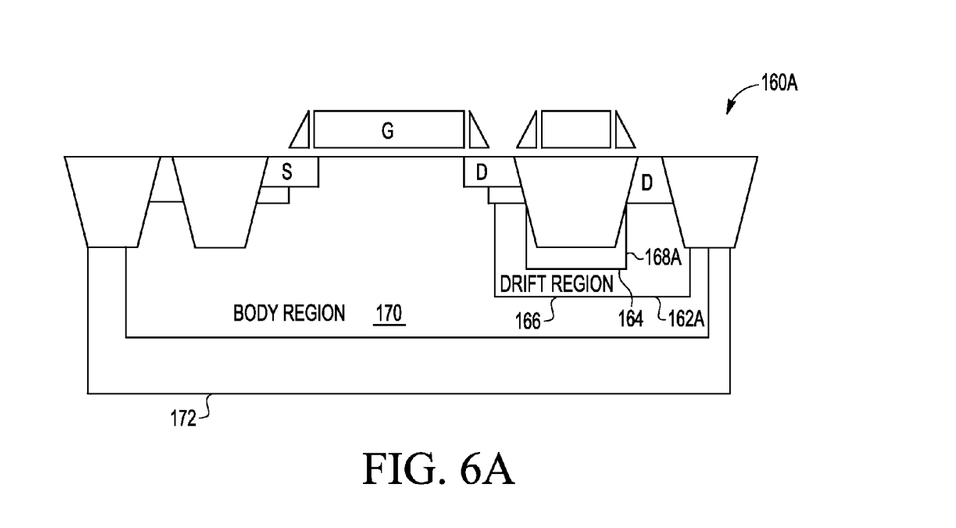
FIGS. 6A and 6B are cross-sectional, schematic views of exemplary field and active drift LDMOS transistors with a false drain in conjunction with a double RESURF structure in accordance with two embodiments.
Figure 6B:
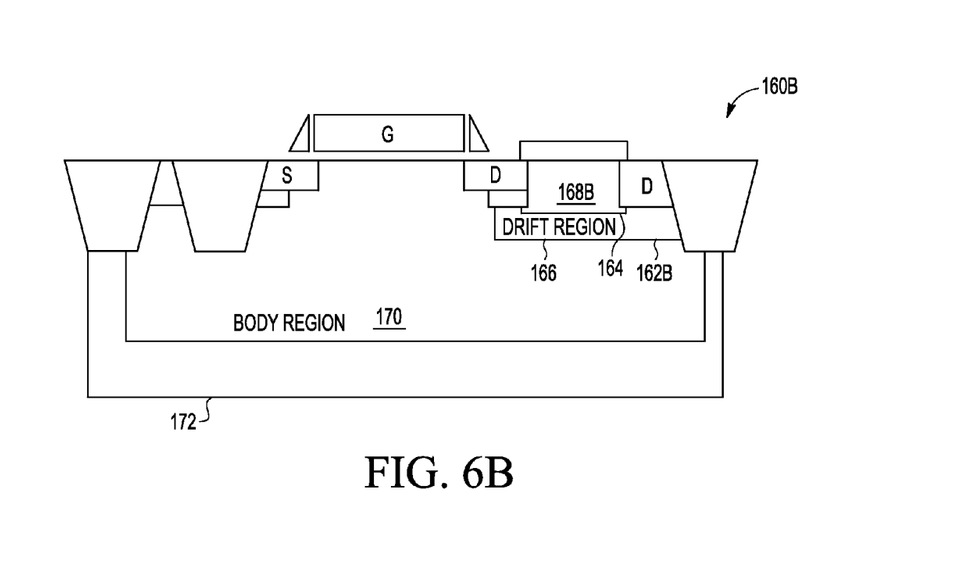

FIGS. 6A and 6B depict further examples of false-drain enabled LDMOS devices 160A, 160B configured for the RESURF effect. In these examples, depletion of field and active drift regions 162A, 162B is achieved in accordance with a double RESURF effect. Each drift region may be depleted from both above, e.g., along an inner junction region 164, as well as below, e.g., along an outer junction region 166. The inner junction region 164 is formed in these examples along an internal p-type region 168A, 168B. The outer junction region 166 is formed along the interface of the drift region 162A, 162B with a body region 170, which extends under the drift region 162A, 162B as described above. An n-type isolating well region 172 may also extend along the body region 170 to define an active area of the devices 160A, 160B.

A field polysilicon layer or flap may be disposed above the drift regions 150A, 162A in the examples of FIGS. 5A and 6A. The polysilicon layer may be useful in further optimizing the tradeoff between on-resistance and breakdown voltage. Further optimization or improvement may be achieved in each of the above-described RESURF devices by configuring the dopant concentration level and other characteristics (e.g., size, positioning, etc.) of the regions that define the RESURF regions.

The above-described false drain regions are disposed on an inner side of a drift region to protect internal device components in and around a channel region from the external bias applied to the active drain region. In one aspect, the configuration of the false drain region and the drift region may involve achieving a resistance between the channel region and the drain region that maintains the internal voltage levels within ranges already established for lower-voltage tier devices. When the internal voltage levels fall in the established range, the false drain region arrangement guarantees gate oxide and HCI reliability for the LDMOS or other high voltage device. The internal and applied drain-source, gate-drain, drain-body, gate-source, source-body, and gate-body voltage levels may be approximately represented as follows:

$$V_{DS}^{Int} = V_{DS}^{App} - (I_{DS} * R(V_{DS}))$$

$$V_{GD}^{Int} = V_{GD}^{App} - (I_{DS} * R(V_{DS}))$$

$$V_{DB}^{Int} = V_{DB}^{App} - (I_{DS} * R(V_{DS}))$$

$$V_{GS}^{Int} = V_{GS}^{App}$$

$$V_{SB}^{Int} = V_{SB}^{App}$$

$$V_{GB}^{Int} = V_{GB}^{App}$$

The dopant concentrations, thicknesses, and other characteristics of the semiconductor regions of the above-described LDMOS devices. The semiconductor regions may have the following approximate concentrations and thicknesses:

|  | Concentration | Thickness |
|---|---|---|
| substrate: | $1 \times 10^{15}/cm^3$ | not applicable |
| isolation well: | $1.5 \times 10^{17}/cm^3$ | 2.0 μm |
| body region: | $1 \times 10^{17}/cm^3$ | 4.0 μm |
| source region: | $1 \times 10^{21}/cm^3$ | 0.35 μm |
| drain region: | $1 \times 10^{21}/cm^3$ | 0.35 μm |
| LDD portion: | $5 \times 10^{18}/cm^3$ | 0.20 μm |
| corner protect: | $5 \times 10^{17}/cm^3$ | 0.4 μm |
| drift region: | $5 \times 10^{16}/cm^3$ | 1.5 μm |

The concentrations and thicknesses may be different in other embodiments. For example, the dopant concentration of the semiconductor substrate 26 may vary considerably.

Figure 7:
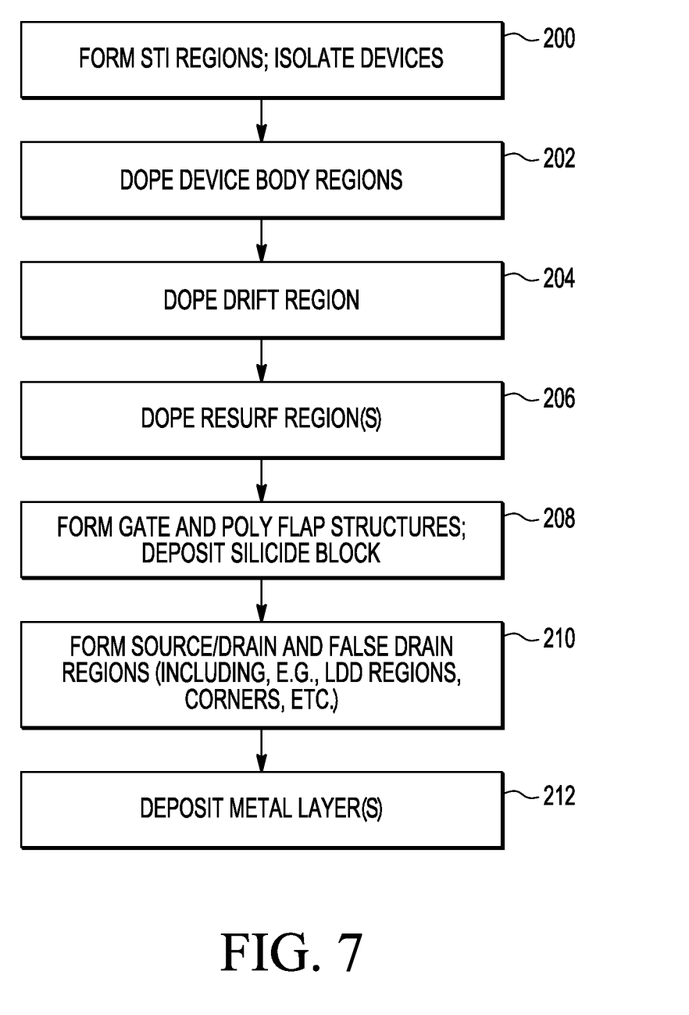
FIG. 7 is flow diagram of an exemplary fabrication sequence to construct an electronic apparatus having a low voltage MOS transistor and an LDMOS transistor with a false drain in accordance with one embodiment.

FIG. 7 shows an exemplary fabrication method for fabricating an electronic apparatus having a lower voltage tier (LV) device and a higher voltage tier (HV) device, such as an LDMOS or other power transistor device, with a false drain as described above. The HV device may be a reduced surface field (RESURF) LDMOS transistor having one or more of the features described above. The LV and HV devices of the electronic apparatus is fabricated with a semiconductor substrate, the regions or layers of which may have the conductivity types of the re-channel examples described above, or be alternatively configured to support a p-channel device. The semiconductor substrate may be a bulk substrate, a bulk substrate with one or more epitaxial layers grown thereon, or an SOI substrate. The method includes a sequence of acts, only the salient of which are depicted for convenience in illustration. The ordering of the acts may vary in other embodiments. The fabrication method is not limited to any particular doping mechanism, and may include future developed doping techniques, gate materials, and insulating dielectric materials.

The method may begin with, or include, an act 200 in which a number of STI regions are formed in the semiconductor substrate. The STI regions may be used to isolate the LV and HV devices from one another. Another STI region may be disposed for positioning within a drift region between a false drain region and a drain region. Any number of STI regions may be etched, grown, or otherwise formed at the surface of the semiconductor substrate. Alternatively, the STI regions are formed after one or more of the active regions of the LV or HV devices are formed. The STI regions may be formed via any now known or hereafter developed procedure. For example, the procedure may include the formation of a trench and the deposition (e.g., chemical vapor deposition, or CVD) of one or more materials in the trench. In some embodiments, the trench is filled with silicon oxide. Additional or alternative materials may be deposited. Alternatively or additionally, isolation may be provided via one or more isolation well regions, such as an n-type barrier layer (NBL), formed via, e.g., ion implantation. Any number of n-type device isolation regions may be formed in the semiconductor substrate to define an active area of, and further isolate, the LV and/or HV devices. As in the examples described above, a ring-shaped isolation well and one or more link regions may be formed. In one example, one or more isolation regions are formed during a respective ion implantation procedure also directed to the formation of one or more n-type regions of the LV device.

P-type body regions of the LV and HV devices may be formed in act 202. For example, the body region may be formed by implanting p-type dopant in a well region in the active area of the LV and HV devices. A drift region of the HV device may be formed in act 204 via, for example, an n-type dopant implantation procedure. The drift region may be disposed for positioning between a drain region and a false drain or channel region of the HV device. Spacing the drain region from the channel region may allow the HV device to operate at a higher voltage level than the LV device. One or more other aspects of the drift region may be configured to further support high drain bias voltage levels. For example, the formation of the drift region may include forming a RESURF junction region via one or more additional dopant implantation procedures directed to forming a p-type region adjacent the drift region. Additional RESURF junction regions may be formed. The order of the acts 202, 204, 206 may vary. For example, in a double RESURF embodiment, a buried region may be formed before one or both of the body and drift regions.

The fabrication process may include one or more procedures collectively shown in act 208. A polysilicon deposition procedure may be implemented in connection with the formation of a gate structure and a polysilicon layer or flap over the drift region. Alternatively or additionally, a salicide block is formed via the deposition of, for instance, a layer of silicon nitride and/or another insulator.

In act 210, source and drain regions may then be formed in, on, or otherwise above the body and drift regions, respectively. As described above, a false drain region is also formed adjacent a channel region of the device such that the respective channel regions of the LV and HV devices have a common configuration, or one or more common configuration characteristics. The false drain region is formed via a common implantation procedure used to form the source and/or drain region of the LV device, as well as the source and/or drain region of the HV device. The formation of these regions may include one or more implantation procedures, using the gate structure for self-alignment on the source side and/or drain side. For example, formation of one or more of the source regions, the false drain region, and the drain regions may include a moderate n-type implant before formation of sidewall spacers of the gate structure to create one or more transition regions (e.g., NLDD regions). An n-type heavy implant after formation of the sidewall spacers may then be implemented to form the source and/or drain regions adjacent to such transition regions. A heavily doped p-type contact region for the device body may be formed in the well via a separate ion implantation procedure, the mask for which may also allow a corner protection region to be formed for the false drain region. Alternatively, a p-type LDD dopant implantation procedure may be used to form the corner protection region. The drain region is spaced from the body region by the drift region and, as described above, a false drain region. The false drain region may be formed during the same implantation procedure(s) directed to forming the active source and drain regions of the device. Corner protection regions may also be formed during act 210 via, for instance, a p-type dopant implantation procedure.

One or more metal layers may then be deposited or otherwise formed in act 212 to, for instance, electrically tie the drain region and the device isolation regions. The composition of the metal layer(s) may vary considerably. The manner in which the metal layer(s) are formed may also vary.

Additional acts may be implemented at various points during the fabrication procedure. For example, one or more acts may be directed to defining an active area of the device.

In some cases, such acts may include the formation of a device isolation well. One or more metal layers may be deposited.

The above-described transistor devices and electronic apparatus are configured such that a false drain allows low and high voltage transistor devices share one or more common structures. A bias voltage is not applied to the false drain. One or more aspects of the intrinsic configuration of the high voltage device are modified to match the configuration of the low voltage device. Rather than changing the isolation region or other external aspects of the electronic apparatus, the modifications are directed to changing the internal electric field at the end of the channel region of the device to match the conditions reached in the low voltage device. The high voltage transistor device may have a false drain region that emulates the drain region of the low voltage transistor device. The false region may be disposed in the location where a conventional LDMOS device typically has an accumulation region.

Emulating an existing lower voltage transistor device, such as a self-aligned MOSFET device, for which HCI and GOX reliability data already exists, allows the development of higher voltage devices to re-use the data, thereby decreasing the time, cost and resources. The higher voltage devices may be more readily integrated into an existing fabrication platform or process in a cost-effective manner. The emulation includes replacing an accumulation of the higher voltage device with an internal, false drain region. The HCI and gate oxide constraints for the higher voltage device may thus be tailored to match or improve upon those of a lower voltage device. As a result, the development process for the high voltage tier device need not include the re-characterization and/or re-certification of HCI and gate oxide reliability. The existing lower voltage qualification may instead be re-used. Such re-use may reduce development cost and/or accelerate device development for a shorter time-to-market development period.

The false drain region of the disclosed devices also allows the collection of data used to confirm that new GOX, HCI and other device characterization tests are not warranted. The false drain region provides an access point to determine whether the existing data may be re-used.

In a first aspect, an electronic apparatus includes a semiconductor substrate, a first transistor disposed in the semiconductor substrate, the first transistor including a channel region and a drain region adjacent the channel region, and a second transistor disposed in the semiconductor substrate and including a channel region, a false drain region adjacent the channel region, and a drain region electrically coupled to the channel region by a drift region such that the second transistor is configured for operation at a higher voltage level than the first transistor. The respective channel regions of the first and second transistors have a common configuration characteristic.

In a second aspect, a device includes a semiconductor substrate having a first conductivity type, a drift region in the semiconductor substrate having a second conductivity type, source and drain regions in the semiconductor substrate having the second conductivity type and electrically coupled to one another by at least a channel region and the drift region, and a false drain region in the semiconductor substrate adjacent the channel region and spaced from the drain region by a trench-free portion of the drift region.

In a third aspect, a method of fabricating an electronic apparatus including defining respective body regions of first and second transistors in a semiconductor substrate, the substrate having a first conductivity type, forming a drain region of the first transistor and a false drain region of the second transistor in the semiconductor substrate via a common dopant implantation procedure, the drain region of the first transistor and the false drain of the second transistor having the second conductivity type and being disposed adjacent a respective channel region in the corresponding body region of the first and second transistors, forming a drift region of the second transistor in the semiconductor substrate, the drift region having the second conductivity type, and forming a drain region of the second transistor in the semiconductor substrate, the drain region having the second conductivity type and being spaced from the false drain region by the drift region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:
   a semiconductor substrate;
   a first transistor disposed in the semiconductor substrate, the first transistor comprising a channel region and a drain region adjacent the channel region; and
   a second transistor disposed in the semiconductor substrate and comprising a channel region, a false drain region adjacent the channel region, and a drain region electrically coupled to the channel region by a drift region such that the second transistor is configured for operation at a higher voltage level than the first transistor;
   wherein the respective channel regions of the first and second transistors have a common configuration characteristic.

2. The electronic apparatus of claim 1, wherein the common configuration characteristic of the respective channel regions comprises a common drain-side end arrangement.

3. The electronic apparatus of claim 2, wherein the common drain-side end arrangement comprises termination at respective lightly doped drain (LDD) sub-regions of the drain region of the first transistor and the false drain region of the second transistor.

4. The electronic apparatus of claim 1, wherein the drain region of the first transistor and the false drain region of the second transistor have a common configuration characteristic.

5. The electronic apparatus of claim 4, wherein the common configuration characteristic of the drain region of the first transistor and the false drain region of the second transistor comprises a common dopant concentration profile.

6. The electronic apparatus of claim 1, wherein the drain region of the second transistor is electrically coupled to the channel region by a field drift region in the semiconductor substrate.

7. The electronic apparatus of claim 6, wherein the second transistor comprises an electric field reduction structure adjacent the field drift region.

8. The electronic apparatus of claim 6, wherein the second transistor comprises a conductive layer disposed above a surface of the semiconductor substrate over the drift region between the false drain region and the drain region of the second transistor.

9. The electronic apparatus of claim 1, wherein the first and second transistors are logic and power transistors, respectively.

10. The electronic apparatus of claim 1, wherein the second transistor includes a reduced surface field (RESURF) structural arrangement.

11. The electronic apparatus of claim 1, wherein the first transistor is a self-aligned metal-oxide-semiconductor field effect transistor (MOSFET) device.

12. The electronic apparatus of claim 1, wherein the first transistor is a complementary metal-oxide semiconductor (CMOS) transistor device.

13. The electronic apparatus of claim 1, wherein the drain region of the first transistor and the false drain region differ in one or more characteristics.

14. The electronic apparatus of claim 1, wherein the false drain region includes a corner protection region spaced from the channel region of the first transistor.

* * * * *